(12) United States Patent
Komaki

(10) Patent No.: US 11,832,424 B2
(45) Date of Patent: Nov. 28, 2023

(54) ELECTRONIC MODULE

(71) Applicant: Sumitomo Wiring Systems, Ltd., Yokkaichi (JP)

(72) Inventor: Kazuya Komaki, Yokkaichi (JP)

(73) Assignee: Sumitomo Wiring Systems, Ltd., Yokkaichi (JP)

(*) Notice: Subject to any disclaimer, the term of this patent is extended or adjusted under 35 U.S.C. 154(b) by 158 days.

(21) Appl. No.: 17/418,489

(22) PCT Filed: Dec. 9, 2019

(86) PCT No.: PCT/JP2019/048105
§ 371 (c)(1),
(2) Date: Jun. 25, 2021

(87) PCT Pub. No.: WO2020/137493
PCT Pub. Date: Jul. 2, 2020

(65) Prior Publication Data
US 2022/0078947 A1 Mar. 10, 2022

(30) Foreign Application Priority Data
Dec. 28, 2018 (JP) ................. 2018-248151

(51) Int. Cl.
| G06F 1/16 | (2006.01) |
| H05K 5/00 | (2006.01) |
| H05K 7/00 | (2006.01) |
| H05K 7/20 | (2006.01) |
| H01H 45/04 | (2006.01) |
| H01H 45/12 | (2006.01) |
| H01H 45/14 | (2006.01) |

(52) U.S. Cl.
CPC ......... *H05K 7/20854* (2013.01); *H01H 45/04* (2013.01); *H01H 45/12* (2013.01); *H01H 45/14* (2013.01); *H01H 2231/026* (2013.01)

(58) Field of Classification Search
CPC .... H05K 7/20854; H01H 45/04; H01H 45/12; H01H 45/14
See application file for complete search history.

(56) References Cited

U.S. PATENT DOCUMENTS

| 2009/0067131 A1* | 3/2009 | Yasuda | H01L 23/4093 |
| | | | 361/707 |
| 2018/0375307 A1* | 12/2018 | Kita | B60R 16/0239 |
| 2019/0082527 A1 | 3/2019 | Kita | |
| 2019/0118735 A1* | 4/2019 | Ota | B60R 16/02 |
| 2019/0230812 A1* | 7/2019 | Shintani | H01R 9/24 |
| 2020/0100353 A1* | 3/2020 | Tanaka | H05K 5/0043 |
| 2023/0123936 A1* | 4/2023 | Komaki | H01H 45/02 |
| | | | 439/76.2 |

FOREIGN PATENT DOCUMENTS

JP  2014-079093 A  5/2014

OTHER PUBLICATIONS

International Search Report, Application No. PCT/JP2019/048105, dated Mar. 3, 2020. ISA/Japan Patent Office.

* cited by examiner

*Primary Examiner* — Anthony M Haughton
(74) *Attorney, Agent, or Firm* — Honigman LLP

(57) ABSTRACT

Provided is an electronic module including a housing case for housing a relay, a heat transfer sheet placed on one wall portion of the housing case, a bus bar that is connected to the relay and is partially in contact with the heat transfer sheet, and a pressing portion that presses the bus bar against the heat transfer sheet.

11 Claims, 8 Drawing Sheets

ELECTRONIC MODULE

CROSS-REFERENCE TO RELATED APPLICATIONS

This application is the U.S. national stage of PCT/JP2019/048105 filed on Dec. 9, 2019, which claims priority of Japanese Patent Application No. JP 2018-248151 filed on Dec. 28, 2018, the contents of which are incorporated herein.

TECHNICAL FIELD

The present disclosure relates to an electronic module for housing an electronic component.

BACKGROUND

JP 2014-79093A discloses a power supply apparatus that includes a relay that has an openable/closable contact and an exciting coil for switching the contact to an open/closed state, in which the contact of the relay is electrically connected to a bus bar, the bus bar including a heat-dissipation mechanism, thus making it possible to use the bus bar as both a current path and a heat-dissipation path, and improve heat dissipation of the relay.

In the power supply apparatus in JP 2014-79093A, a portion of the bus bar connected to the electronic component (relay) is in contact with a chassis via a heat transfer sheet, and heat generated by the electronic component is transferred to the chassis via the bus bar and the heat transfer sheet and dissipated.

However, when there is a design tolerance or error in the size of the electronic component or the bus bar, there is a problem in that contact between the bus bar and the heat transfer sheet will be cancelled.

The power supply apparatus in JP 2014-79093A cannot solve this problem.

In view of this, an object of the present disclosure is to provide an electronic module with which contact between a bus bar and a heat transfer sheet can be ensured even when there is a design tolerance or a manufacturing error in the size of the electronic component or the bus bar.

SUMMARY

An electronic module according to an aspect (independent claim) of the present disclosure is an electronic module including a housing case that houses an electronic component, a heat transfer sheet that is placed on an inner surface of one wall portion of the housing case, a bus bar that is connected to the electronic component and is partially in contact with the heat transfer sheet, and a pressing portion that presses the bus bar against the heat transfer sheet.

Advantageous Effects of Disclosure

According to an aspect of the present disclosure, contact between a bus bar and a heat transfer sheet can be ensured even when there is a design tolerance or a manufacturing error in the size of the electronic component or the bus bar.

DETAILED DESCRIPTION OF PREFERRED EMBODIMENTS

Figure 1:
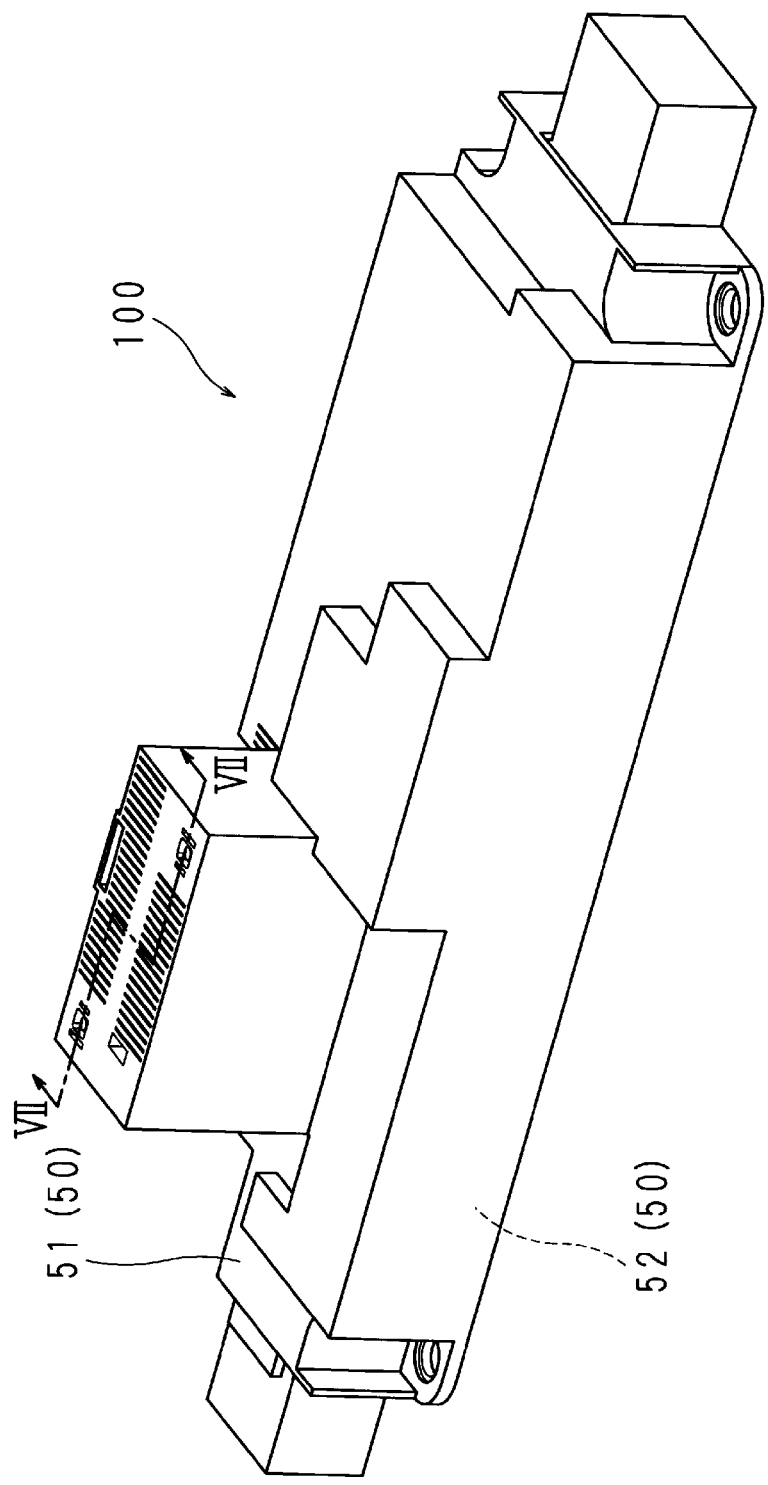
FIG. 1 is a perspective view showing an electronic module according to an embodiment.

First, embodiments of the present disclosure will be listed and illustrated. At least some of the embodiments to be described below may be combined as appropriate.

The electronic module according to one aspect of the present disclosure is an electronic module including a housing case that houses an electronic component, a heat transfer sheet that is placed on an inner surface of one wall portion of the housing case, a bus bar that is connected to the electronic component and is partially in contact with the heat transfer sheet, and a pressing portion that presses the bus bar against the heat transfer sheet.

In this aspect, the pressing portion presses the bus bar against the heat transfer sheet and forcibly brings the bus bar into contact with the heat transfer sheet. Accordingly, even when there is a design tolerance or a manufacturing error, contact between the bus bar and the heat transfer sheet can be ensured and heat generated by the electronic component can be stably dissipated.

In the electronic module according to one aspect of the present disclosure, the pressing portion may also be formed in one piece with the housing case.

In this aspect, since the pressing portion is formed in one piece with the housing case, there is no need for providing another process for providing the pressing portion. Accordingly, the manufacturing process of the electronic module can be shortened.

In the electronic module according to one aspect of the present disclosure, the pressing portion may also press a plurality of portions of the bus bar.

In this aspect, the pressing portion presses a plurality of portions of the bus bar. In other words, the pressing portion presses the bus bar against the heat transfer sheet over a predetermined range. Accordingly, contact between the bus bar and the heat transfer sheet can be reliably maintained.

In the electronic module according to one aspect of the present disclosure, the pressing portion may also include a hollow body having a plurality of openings in a contact surface that comes into contact with the bus bar.

In this aspect, the pressing portion includes a hollow body having a plurality of openings in the contact surface that comes into contact with the bus bar. Accordingly, the pressing portion can press the bus bar against the heat transfer sheet over a predetermined range, while reducing the weight of the electronic module.

In the electronic module according to one aspect of the present disclosure, a configuration is also possible in which the electronic component includes a terminal to which the bus bar is connected on one surface that opposes the one wall portion, the electronic module further includes a contact pin member that has a retaining head portion, is inserted into a through-hole that is formed in the bus bar, and brings the bus bar into contact with the terminal, and a portion of the heat transfer sheet is interposed between the retaining head portion and the one wall portion.

In this aspect, the heat transfer sheet is interposed between a portion of the bus bar and the retaining head portion, and the one wall portion. Accordingly, when heat is generated by the electronic component, the heat is transferred to the one wall portion of the housing case via the contact pin member and the heat transfer sheet, and is dissipated. Further, the heat is transferred to the one wall portion of the housing case via the bus bar and the heat transfer sheet and is dissipated.

The present disclosure will be specifically described below based on the drawings that illustrate the embodiments. The electronic module according to the embodiment of the present disclosure will be described below with reference to the drawings. Note that the present disclosure is not limited to illustrations of these, but is indicated by the claims, and all changes that come within the meaning and range of equivalency of the claims are intended to be embraced therein.

Hereinafter, the present embodiment will be described taking an electronic module that houses a relay, which is an example of an electronic component, as an example.

FIG. 1 is a perspective view showing an electronic module 100 according to the present embodiment. The electronic module 100 includes a housing case 50 for housing the electronic component. The housing case 50 is formed by a lower case 52 on which a relay 10 is placed and an upper case 51 for covering the lower case 52.

Figure 2:
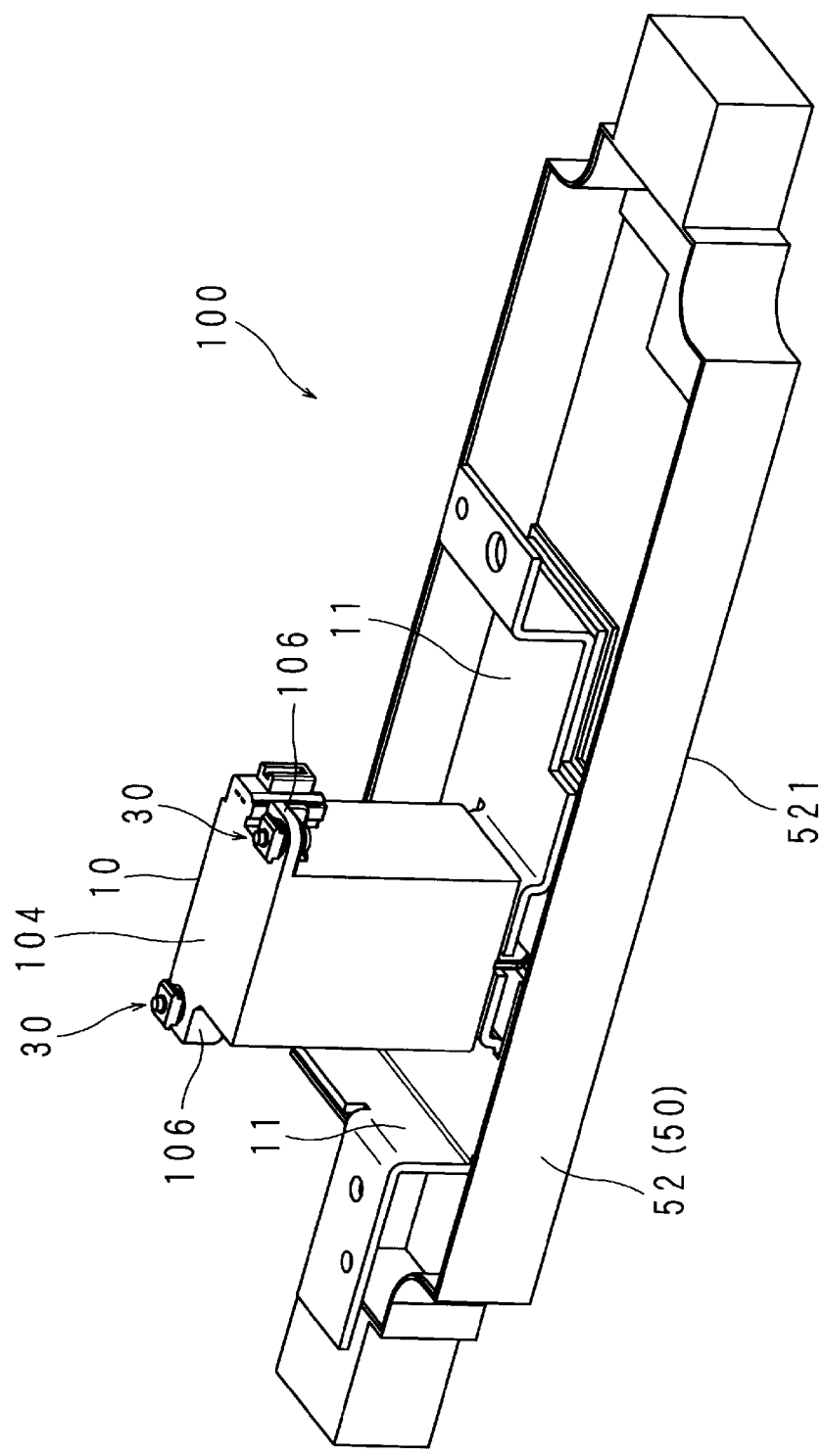
FIG. 2 is a perspective view showing a state in which an upper case has been removed from the electronic module according to the embodiment.

FIG. 2 is a perspective view showing a state where the upper case 51 has been removed from the electronic module 100 according to the present embodiment. The housing case 50 houses the relay 10, which is an electronic component, for example.

The relay 10 is switched on when the vehicle is being driven, and switched off when the vehicle is not being driven, for example.

Figure 6:
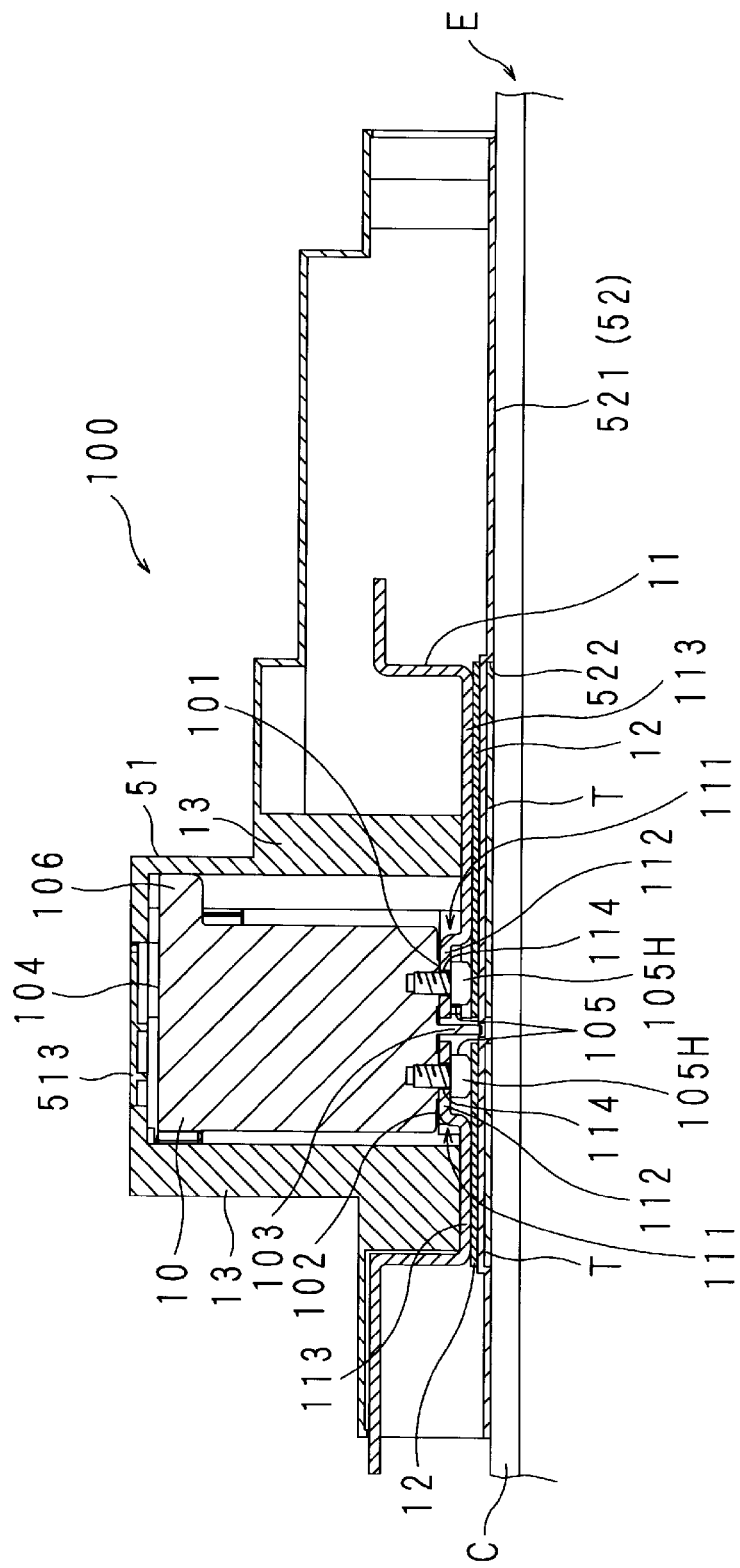
FIG. 6 is a cross-sectional view taken along line VI-VI in FIG. 4.

The electronic module 100 is attached to, for example, the outside of a battery pack of an EV (Electric Vehicle) (see FIG. 6). In other words, the electronic module 100 according to the present embodiment is attached such that a bottom plate 521 (one wall portion) of the lower case 52 opposes the battery pack. More specifically, the bottom plate 521 of the lower case 52 is in contact with the battery pack via a heat transfer sheet T.

Heat transfer sheets 12 (described later) are placed on the inner surface of the bottom plate 521 of the lower case 52, and one surface of each of the heat transfer sheets 12 is in contact with the inner surface of the bottom plate 521. Further, bus bars 11 (described later) connected to the relay 10 are arranged so as to be partially in contact with the other surfaces of the heat transfer sheets 12.

Figure 3:
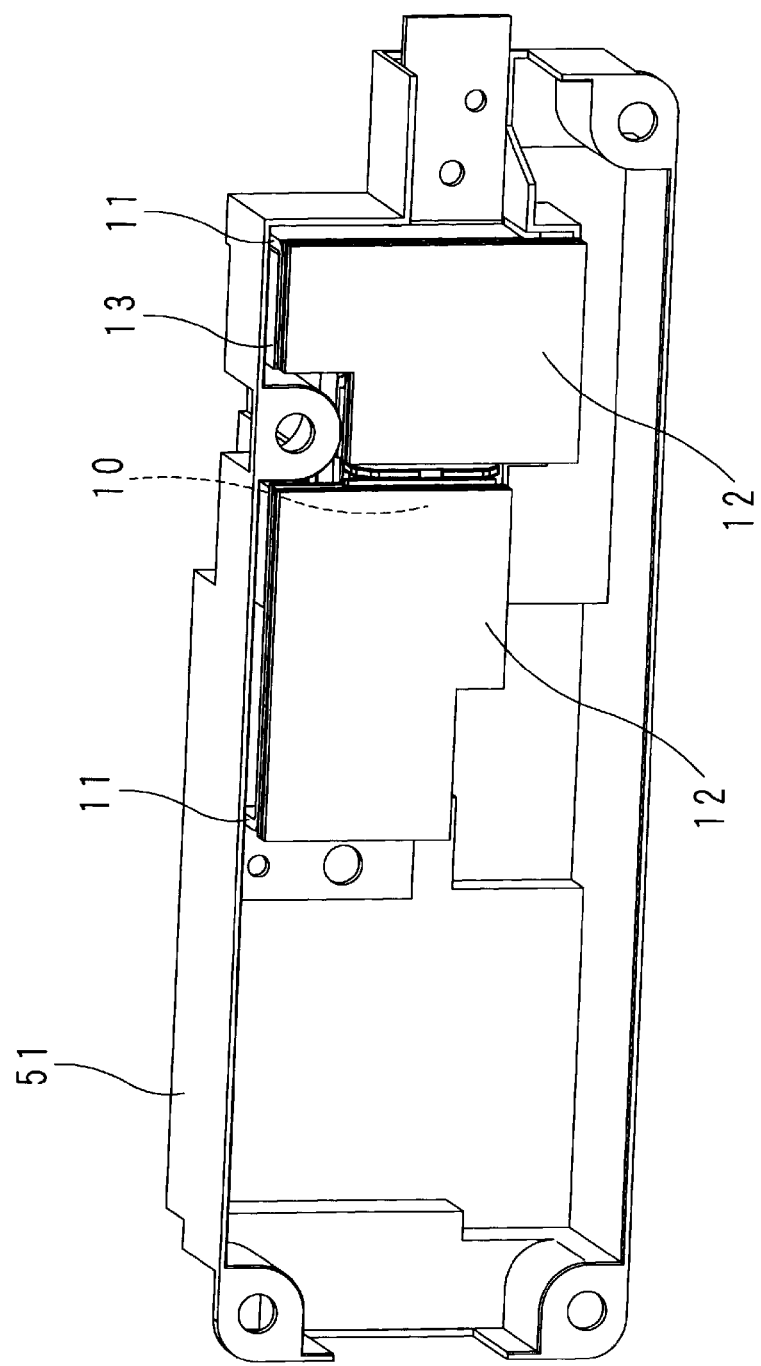
FIG. 3 is a diagram showing a state in which a lower case has been removed from the electronic module according to the embodiment.
Figure 4:
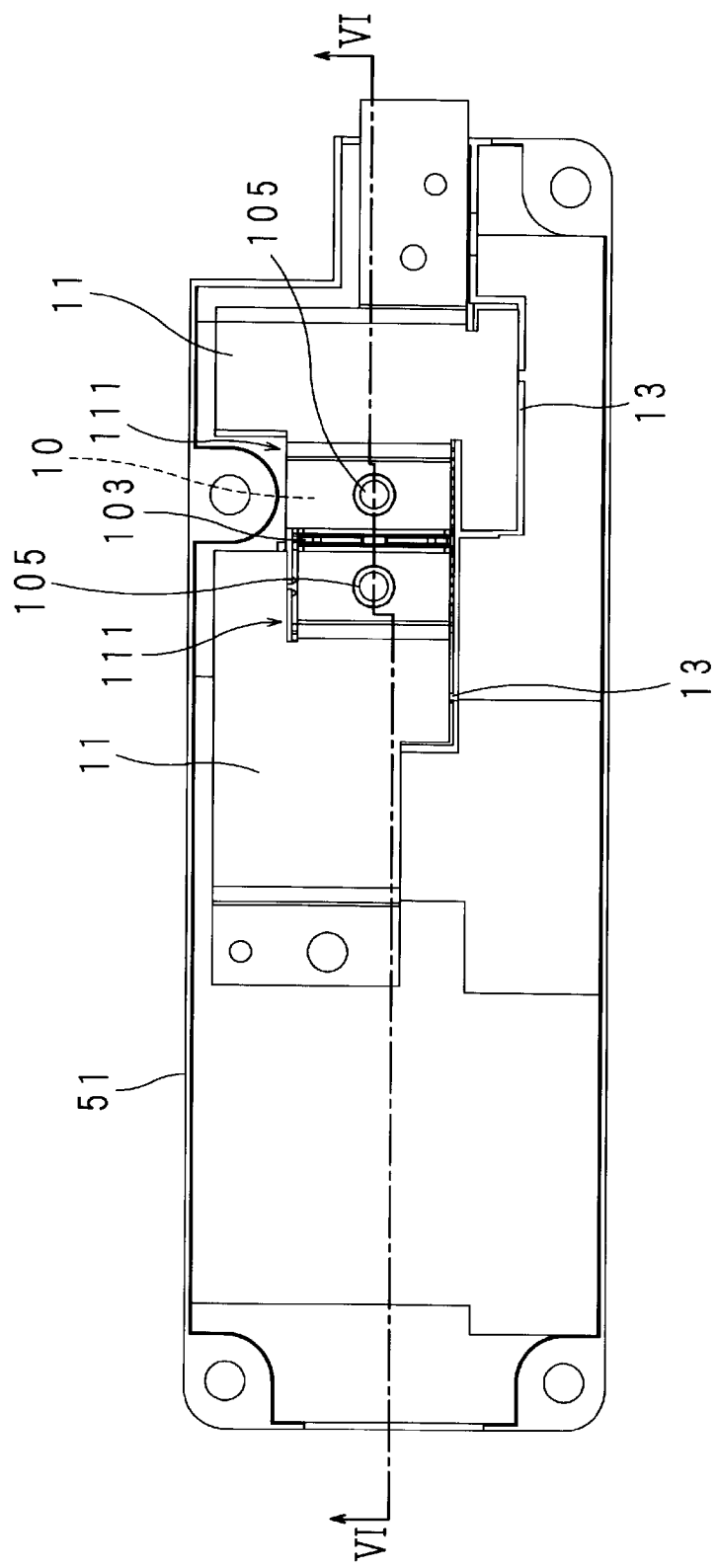
FIG. 4 is a diagram showing a state in which the lower case and a heat transfer sheet have been removed from the electronic module according to the embodiment.
Figure 5:
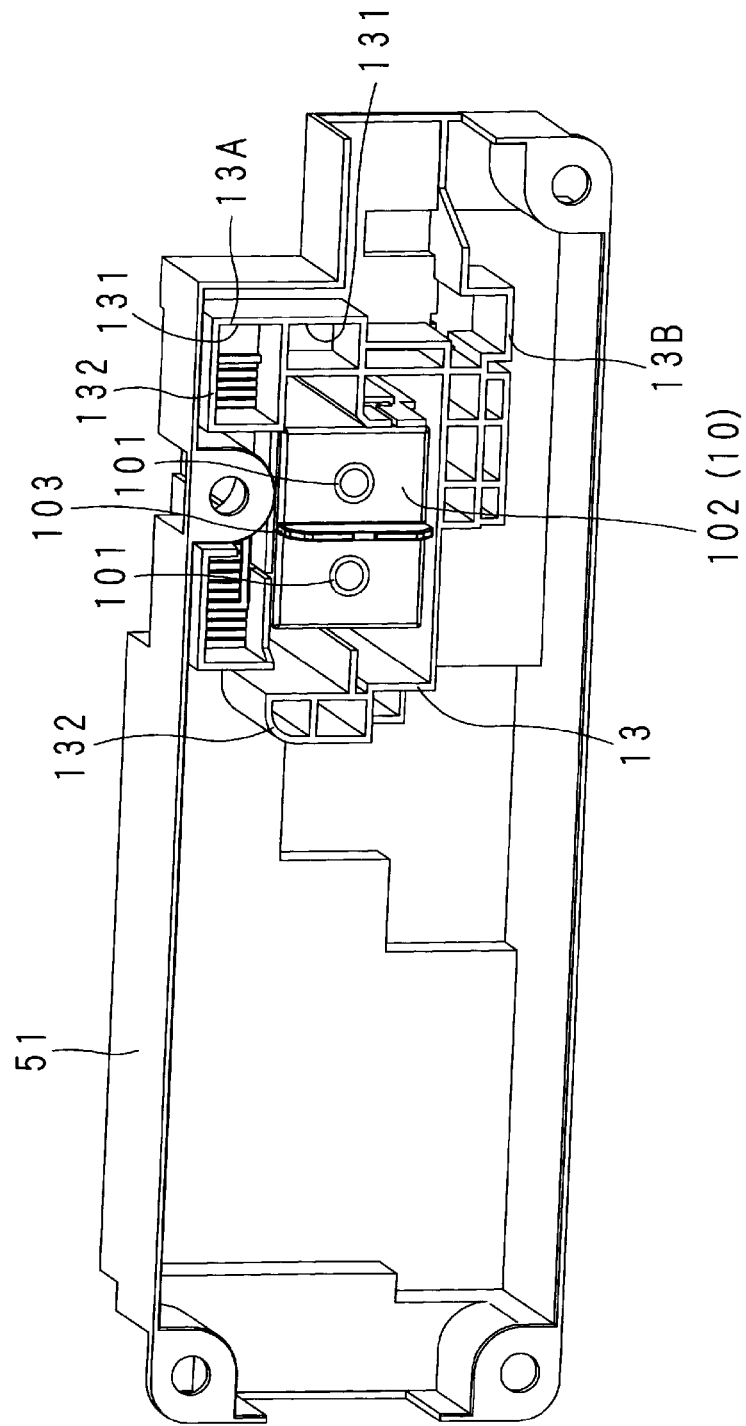
FIG. 5 is a diagram showing a state in which the lower case, the heat transfer sheet, and a bus bar have been removed from the electronic module according to the embodiment.

FIG. 3 is a diagram showing a state where the lower case 52 has been removed from the electronic module 100 according to the present embodiment, FIG. 4 is a diagram showing a state where the lower case 52 and the heat transfer sheets 12 have been removed from the electronic module 100 according to the present embodiment, and FIG. 5 is a diagram showing a state where the lower case 52, the heat transfer sheets 12, and the bus bars 11 have been removed from the electronic module 100 according to the present embodiment.

In other words, FIG. 3 shows a positional relationship between the relay 10, the bus bars 11, and the heat transfer sheets 12, and FIG. 4 shows a positional relationship between the relay 10 and the bus bars 11.

FIG. 6 is a cross-sectional view taken along line VI-VI in FIG. 4. For illustrative reasons, FIG. 6 shows a state where the electronic module 100 is attached to the outside of a cooling portion C of a battery pack E. In other words, in the electronic module 100, the bottom plate 521 of the lower case 52 is cooled from the outside.

The relay 10 is shaped as a cuboid, and two terminals 101 that are respectively connected to the bus bars 11 are formed on one surface 102 opposing the bottom plate 521 of the lower case 52. The terminals 101 are shaped as a cylinder, embedded in the relay 10, and only one end portions thereof are exposed from the one surface 102. A screw thread is formed on the inner surface of each terminal 101, and a bolt 105 (described later) is screwed into each terminal 101.

Further, a partitioning plate 103 stands between the two terminals 101 in the direction intersecting the one surface 102. The partitioning plate 103 is approximately rectangular shaped, and the two terminals 101 are partitioned from each other by the partitioning plate 103. The partitioning plate 103 is provided such that the leading end thereof is spaced apart from the bottom plate 521 of the lower case 52 by a predetermined interval. Accordingly, a case can be prevented where the partitioning plate 103 collides with the bottom plate 521 during vibration, which causes noise, a damage, or the like.

In the relay 10, two extending pieces 106 respectively extend from two opposing edges of another surface 104 on the side opposite to the one surface 102. The two extending pieces 106 are provided diagonally to each other and extend from the edges of the other surface 104. Through-holes are respectively formed in the extending pieces 106, and the relay 10 is fixed to the upper case 51 by using the through-holes and fixing mechanisms 30 (described later). The method for fixing the relay 10 will be described in detail later.

The bus bars 11 are each formed by a metal plate with good conductivity, for example, and the bus bars 11 are respectively connected to the terminals 101 of the relay 10. The bus bars 11 each have a crank portion 111 having a cross section shaped like a crank. In each crank portion 111, two flat plate portions are coupled by a bent portion. In the crank portion 111, of the two flat plate portions, one portion 112 is connected to the terminal 101, and another portion 113 is in contact with the other surface of the heat transfer sheet 12.

A through-hole 114 penetrating the one portion 112 in the thickness direction is formed in the one portion 112 of each crank portion 111. The bolt 105 (contact pin member) is screwed into the terminal 101 via the through-hole 114, and thus the bus bar 11 (one portion 112) is fixed and connected to the terminal 101. In other words, the bolt 105 includes a retaining head portion 10511 at one end on the bus bar 11 side, and the bus bar 11 is fixed to the terminal 101 as a result of the other end of the bolt 105 being inserted into the through-hole 114 of the one portion 112 and screwed into the terminal 101 of the relay 10.

With this configuration, with the electronic module 100 according to the present embodiment as described above, the bus bars 11 are respectively securely attached to the terminals 101. Specifically, even when the electronic module 100 is used in a vehicle, which is an environment constantly subjected to vibrations, the connection between the relay 10 (terminals 101) and the bus bars 11 can be reliably maintained.

As described above, the heat transfer sheets 12 are respectively interposed between the respective other portions 113 of the crank portions 111 and the bottom plate 521 of the lower case 52. The heat transfer sheets 12 are plated-shaped, and arranged at least in the regions of the bottom plate 521 of the lower case 52 that correspond to the other portions 113 of the crank portions 111 and the retaining head portions 10511 of the bolts 105. In other words, the heat transfer sheets 12 are interposed between the other portions 113 of the crank portions 111 and the bottom plate 521 of the lower case 52 and between the retaining head portions 10511 of the bolts 105 and the bottom plate 521 of the lower case 52.

With this configuration, in the electronic module 100 according to the present embodiment, heat generated by the relay 10 is rapidly transferred to the heat transfer sheets 12 via the bolts 105 or the bus bars 11. Further, this heat is transferred from the heat transfer sheets 12 to the bottom plate 521 of the lower case 52, and cooled at the bottom plate 521. Also, the heat transferred from the relay 10 to the bus bars 11 and the heat generated by the bus bars 11 is transferred to the bottom plate 521 via the heat transfer sheets 12, and cooled at the bottom plate 521.

Also, in the electronic module 100 according to the present embodiment, the heat transfer sheet T is provided on the outer side of the bottom plate 521 of the lower case 52 (see FIG. 6). A recessed portion 522 is formed at a position on the outer side of the bottom plate 521 of the lower case 52 that opposes the heat transfer sheets 12 in the direction in which a top plate 513 of the upper case 51 opposes the bottom plate 521 of the lower case 52. The recessed portion 522 has a shape conforming to the heat transfer sheet T, and the heat transfer sheet T is arranged inside the recessed portion 522.

In other words, a position, of the bottom plate 521 of the lower case 52, where heat concentrates is provided with the heat transfer sheet T, which facilitates heat transfer between the bottom plate 521 and the cooling portion C of the battery pack E, and the cooling effect can be improved.

Further, since the heat transfer sheet T is arranged within the recessed portion 522, contact between the bottom plate 521 of the lower case 52 and the outer side of the battery pack E (cooling portion C) in the other portion is not hindered by the heat transfer sheet T.

In addition, the one surface 102 of the relay 10 on which the terminals 101 are mounted faces the bottom plate 521 of the lower case 52, and is a surface that is closest to the bottom plate 521. Accordingly, the transfer path through which heat generated by the relay 10 is transferred to the heat transfer sheet 12 is the shortest. Thus, heat generated by the relay 10 can be rapidly and efficiently dissipated.

In the upper case 51, a pressing portion 13 for pressing the bus bars 11 against the heat transfer sheets 12 is provided protruding from the top plate 513 to which the relay 10 is fixed. The pressing portion 13 is a frame body that extends in a direction intersecting the top plate 513, that is, the opposing direction, and presses the other portions 113 of the crank portions 111 of the bus bars 11 toward the heat transfer sheets 12. For example, the pressing portion 13 is formed in one piece with the upper case 51.

The size of the pressing portion 13 in the extending direction is slightly greater than a value (hereinafter referred to as a "resultant value") obtained by subtracting the sum of the thickness of the heat transfer sheet 12 and the thickness of the bus bar 11 (other portion 113) from the gap between the top plate 513 of the upper case 51 and the bottom plate 521 of the lower case 52. For example, the size of the pressing portion 13 in the extending direction is obtained by adding the tolerance value of the relay 10 to the resultant value. In other words, the pressing portion 13 forcibly connects the other portions 113 of the crank portions 111 to the heat transfer sheets 12.

The pressing portion 13 includes tubular pressing portions 13A (hollow body) and a plate-shaped pressing portion 13B. The pressing portions 13A each have an approximately rectangular cross-section, and a plurality of pressing portions 13A are arranged side by side. Each pressing portion 13A includes an opening 131 in a contact surface 132 that comes into contact with the other portions 113 of the crank portions 111, and a plurality of the openings 131 of the respective pressing portions 13A form a lattice shape.

The pressing portion 13B extends from the edge of the side wall of part of the pressing portions 13A, and includes a plurality of bent portions. The bent portions are bent with the opposing direction acting as the axis. The size of the pressing portion 13B in the opposing direction is the same as that of the pressing portions 13A.

As seen from FIG. 4 and FIG. 5, the pressing portions 13A and the pressing portion 13B are provided in a predetermined range, and the contact surfaces 132 of the pressing portions 13A and the contact surface 132 of the pressing portion 13B comes into contact with the other portions 113 of the crank portions 111 at a plurality of positions. In other words, the contact surfaces 132 of the pressing portions 13A and the contact surface 132 of the pressing portion 13B simultaneously press the other portions 113 of the crank portions 111 onto the heat transfer sheets 12 at a plurality of positions.

With the configuration described above, the electronic module 100 according to the present embodiment can reliably maintain contact between the other portions 113 of the crank portions 111 and the heat transfer sheets 12.

Specifically, a case is envisioned in which the size in the opposing direction of the relay 10 is reduced due to a manufacturing tolerance or a manufacturing error. On the other hand, since the relay 10 is fixed to the upper case 51, if the size in the opposing direction of the relay 10 is reduced, the positions of the bus bars 11 also shift toward the upper case 51. In this case, there is a risk that contact between the bus bars 11 (the other portions 113 of the crank portions 111) and the heat transfer sheets 12 will be cancelled.

In view of this, in the electronic module 100 according to the present embodiment, as described above, the pressing portion 13 presses the other portions 113 of the crank portions 111 against the heat transfer sheets 12 and forcibly connects the other portions 113 to the heat transfer sheets 12. Accordingly, contact between the other portions 113 of the crank portions 111 and the heat transfer sheets 12 can be reliably maintained without being affected by the tolerance or a manufacturing error.

Further, in the electronic module 100 according to the present embodiment, as described above, the pressing portions 13A and 13B simultaneously press the other portions 113 of the crank portions 111 at a plurality of positions. Accordingly, contact between the other portions 113 of the crank portions 111 and the heat transfer sheets 12 can be more reliably maintained.

Further, in the electronic module 100 according to the present embodiment, since the pressing portions 13A are tubular bodies as described above, the weight of the electronic module 100 can be further reduced.

Figure 7:
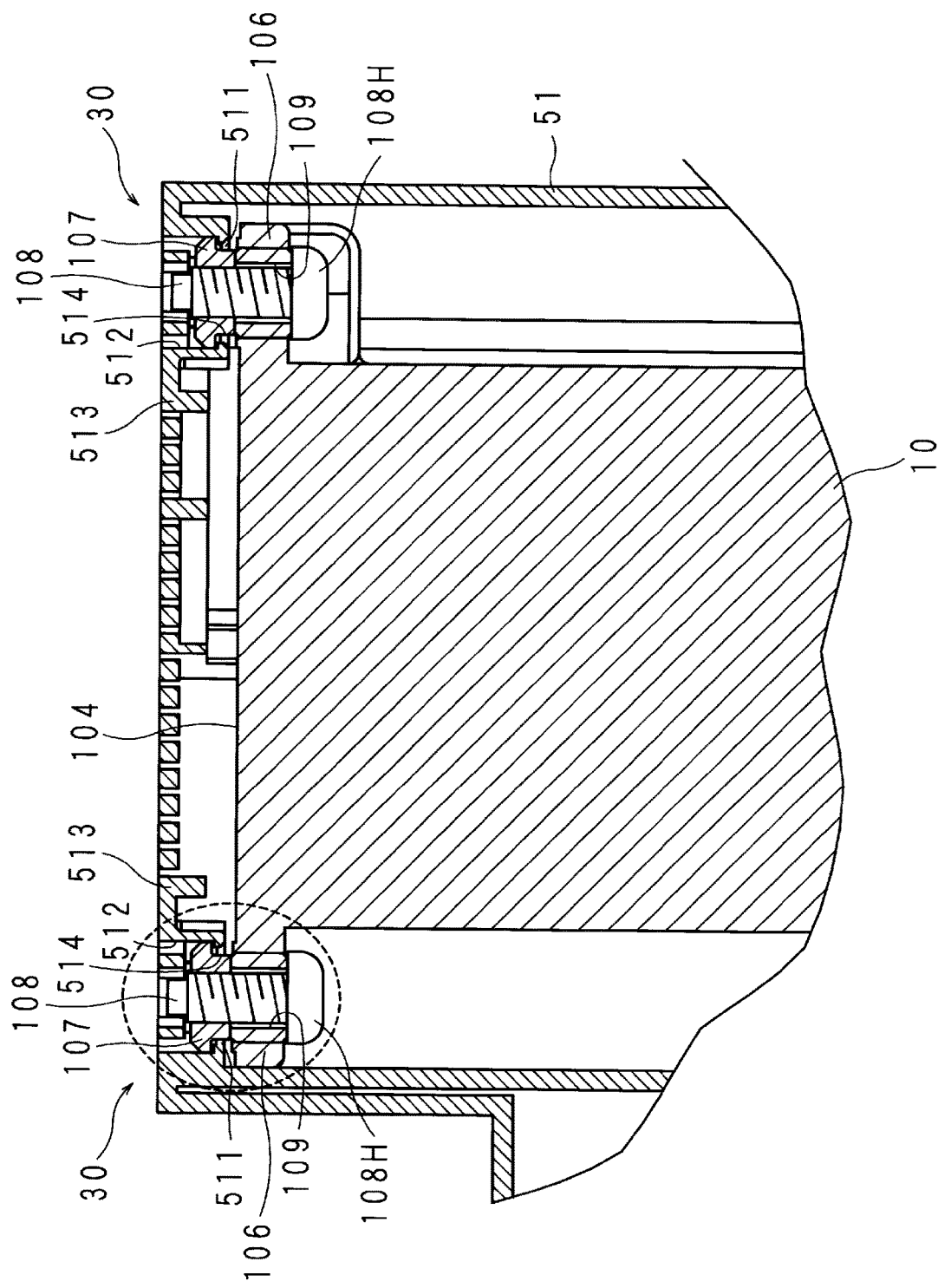
FIG. 7 is a cross-sectional view taken along line VII-VII in FIG. 1.
Figure 8:
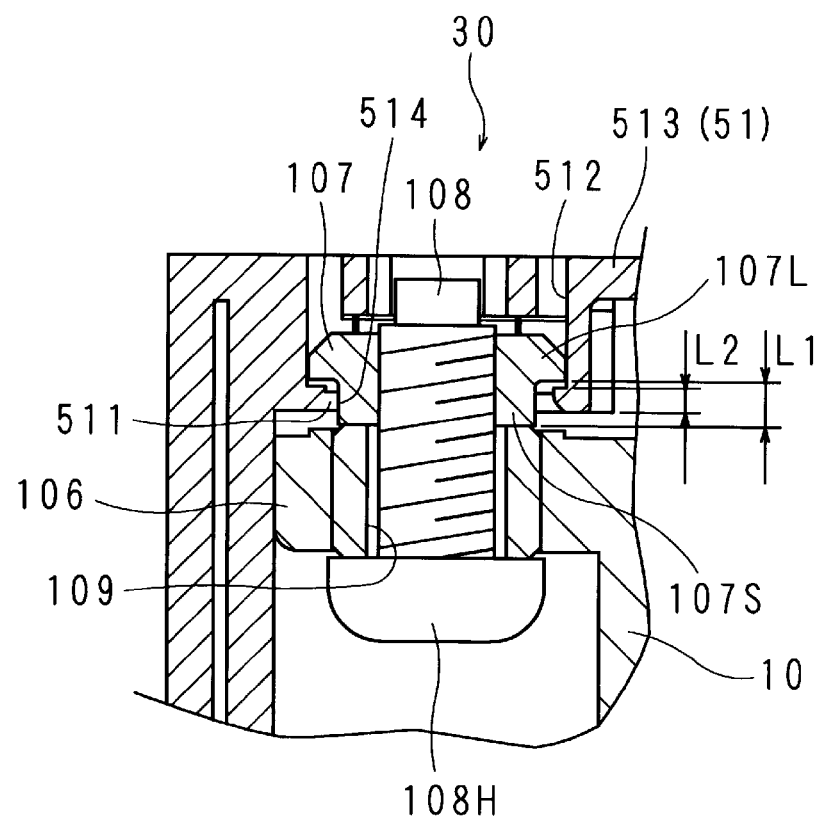
FIG. 8 is an enlarged view showing a portion surrounded by the dashed circle in FIG. 7 in an enlarged manner.
JP 2014-79093AJP 2014-79093A

FIG. 7 is a cross-sectional view taken along line VII-VII in FIG. 1, and FIG. 8 is an enlarged view showing a portion surrounded by a dashed circle in FIG. 7 in an enlarged manner. Hereinafter, the fixing mechanism 30 of the relay 10 will be described using FIG. 7 and FIG. 8.

The top plate 513 of the upper case 51 has a rectangular shape (see FIG. 1), and two recesses 512 are diagonally provided on the outer surface of the top plate 513. Bottom plates 511 of the recesses 512 are circular shaped, and through-holes 514 that bring the inside and outside of the bottom plates 511 into communication are formed in the central portions of each bottom plates 511. A cylindrical screwing member 107 is inserted into each through-hole 514.

Each screwing member 107 includes a small outer diameter portion 107S having an outer diameter the same as that of the through-hole 514 and a large outer diameter portion 107L having an outer diameter the same as that of the edge of the bottom plate 511. On the other hand, the small outer diameter portion 107S and the large outer diameter portion 107L have the same inner diameter, and a screw thread (not shown) is formed on the inner side of the small outer diameter portion 107S and the large outer diameter portion 107L. When the relay 10 is fixed to the top plate 513, the small outer diameter portion 107S is internally fitted into the through-hole 514 of the recess 512, and the large outer diameter portion 107L is internally fitted into the recess 512.

Since the screwing member 107 includes the small outer diameter portion 107S and the large outer diameter portion 107L in this manner, the large outer diameter portion 107L radially protrudes from the small outer diameter portion 107S. Accordingly, this protruding portion of the large outer diameter portion 107L catches on the edge portion of the through-hole 514 of the bottom plate 511 of the recess 512. In other words, the large outer diameter portion 107L serves as the retaining member.

Further, as described above, the two extending pieces 106 respectively extends from the two opposing edges of the other surface 104 of the relay 10. Each extending piece 106 includes a through-hole 109 that penetrates the extending piece 106 in the thickness direction. The inner diameter of the through-hole 109 is the same as that of the screwing member 107.

By screwing the bolt 108 into the screwing member 107 via the through-hole 109, the relay 10 is fixed to the top plate 513. The bolt 108 includes a retaining head portion 10811 at one end. In other words, each fixing mechanism 30 of the relay 10 is formed by the bolt 108, the through-hole 109 of the extending piece 106, the screwing member 107, and the through-hole 514 of the recess 512.

The relay 10 is fixed to the top plate 513 by the other end of the bolts 108 being inserted to the through-holes 109 of the extending pieces 106 and screwed into the screwing members 107. At this time, each extending piece 106 is fitted between the screwing member 107 (small outer diameter portion 107S) and the retaining head portion 10811 of the bolt 108.

On the other hand, the size L1 of the small outer diameter portion 107S in the longitudinal direction of the bolt 108 or the thickness direction of the extending piece 106 is larger than the thickness L2 of the bottom plate 511 of the recess 512. The size L1 of the small outer diameter portion 107S is determined based on the tolerance value of the relay 10, for example.

In this manner, since the size L1 of the small outer diameter portion 107S is larger than the thickness L2 of the bottom plate 511, even in a state where the bolt 108 is screwed together with the screwing member 107 and the extending piece 106 is fitted between the small outer diameter portion 107S and the retaining head portion 10811 of the bolt 108, the screwing member 107 and the extending piece 106 can shift in the thickness direction of the extending piece 106 within a predetermined range.

In other words, the electronic module 100 according to the present embodiment is configured such that the relay 10 can shift in the opposing direction within the range "L1 to L2" in the state of being fixed to the top plate 513 with the fixing mechanisms 30.

With this configuration, the electronic module 100 can accommodate a manufacturing tolerance or a manufacturing error of the relay 10 in the opposing direction.

Specifically, there are cases in which the sizes in the opposing direction of the relays 10 vary due to a manufacturing tolerance or a manufacturing error.

In view of this, in the electronic module 100 according to the present embodiment, since the relay 10 can shift in the opposing direction within the range "L1 to L2", variation in size due to a tolerance or error can be absorbed.

The embodiments disclosed herein are examples in all respects, and are not to be construed as limiting. The scope of the present disclosure is defined by the claims rather than by the meaning of the description above, and all modifications equivalent to and within the scope of the claims are intended to be encompassed.

The invention claimed is:

1. An electronic module comprising:
a housing case for housing an electronic component, the housing including a bottom plate, the electronic component including a terminal and a main body, the terminal disposed on a bottom surface of the main body;
a heat transfer sheet that is placed on an inner surface of the bottom plate of the housing case;
a bus bar that is connected to the terminal of the electronic component, the bus bar interposed between the heat transfer sheet and the terminal of the electronic component; and
a pressing portion that presses the bus bar against the heat transfer sheet.

2. The electronic module according to claim 1, wherein the pressing portion is formed in one piece with the housing case.

3. The electronic module according to claim 1, wherein the pressing portion presses a plurality of portions of the bus bar.

4. The electronic module according to claim 1, wherein the pressing portion includes a hollow body having an opening on one end and closed on the other end, the opening comes into contact with the bus bar.

5. The electronic module according to claim 1, wherein the electronic module further includes a contact pin member that has a retaining head portion, is inserted into a through-hole that is formed in the bus bar and into the terminal of the electronic component, and brings the bus bar into contact with the terminal, and
a portion of the heat transfer sheet is interposed between the retaining head portion and the bottom wall.

6. The electronic module according to claim 2, wherein the pressing portion presses a plurality of portions of the bus bar.

7. The electronic module according to claim 2, wherein the pressing portion includes a hollow body having an opening on one end and closed on the other end, the opening comes into contact with the bus bar.

8. The electronic module according to claim 3, wherein the pressing portion includes a hollow body having an opening on one end and closed on the other end, the opening comes into contact with the bus bar.

9. The electronic module according to claim 2, wherein the electronic module further includes a contact pin member that has a retaining head portion, is inserted into a through-hole that is formed in the bus bar and into the terminal of the electronic component, and brings the bus bar into contact with the terminal, and a portion of the heat transfer sheet is interposed between the retaining head portion and the bottom wall.

10. The electronic module according to claim 3, wherein the electronic module further includes a contact pin member that has a retaining head portion, is inserted into a through-hole that is formed in the bus bar and into the terminal of the electronic component, and brings the bus bar into contact with the terminal, and a portion of the heat transfer sheet is interposed between the retaining head portion and the bottom wall.

11. The electronic module according to claim 4, wherein the electronic module further includes a contact pin member that has a retaining head portion, is inserted into a through-hole that is formed in the bus bar and into the terminal of the electronic component, and brings the bus bar into contact with the terminal, and a portion of the heat transfer sheet is interposed between the retaining head portion and the bottom wall.

\* \* \* \* \*